(12) United States Patent
Cho et al.

(10) Patent No.: US 8,361,818 B2
(45) Date of Patent: Jan. 29, 2013

(54) METHOD OF FORMING OPTICAL SENSOR

(75) Inventors: An-Thung Cho, Hsin-Chu (TW);
Chia-Tien Peng, Hsin-Chu (TW);
Kun-Chih Lin, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 220 days.

(21) Appl. No.: 12/874,203

(22) Filed: Sep. 1, 2010

(65) Prior Publication Data
US 2010/0330735 A1 Dec. 30, 2010

Related U.S. Application Data

(62) Division of application No. 12/346,857, filed on Dec. 31, 2008, now Pat. No. 7,816,751.

(30) Foreign Application Priority Data

May 16, 2008 (TW) .............................. 97118202 A (51) Int. Cl.
*H01L 21/00* (2006.01)
(52) U.S. Cl. .................. 438/29; 438/7; 438/16; 438/59; 257/444; 257/290

(58) Field of Classification Search .................... 257/44, 257/290; 438/7, 16, 59, 686, 381, 26, 29
See application file for complete search history.

(56) References Cited

U.S. PATENT DOCUMENTS

| 6,310,371 | B1 | 10/2001 | Hung |
| 7,259,055 | B2 | 8/2007 | Li |
| 2006/0180816 | A1 | 8/2006 | Li |
| 2006/0211267 | A1 | 9/2006 | Joshi |
| 2008/0178794 | A1* | 7/2008 | Cho et al. ................. 117/103 |
| 2008/0179762 | A1 | 7/2008 | Cho |

FOREIGN PATENT DOCUMENTS

CN 1706050 A 12/2005

\* cited by examiner

*Primary Examiner* — Telly Green
(74) *Attorney, Agent, or Firm* — Winston Hsu; Scott Margo (57) ABSTRACT

A method of forming an optical sensor includes the following steps. A substrate is provided, and a read-out device is formed on the substrate. a first electrode electrically connected to the read-out device is formed on the substrate. a photosensitive silicon-rich dielectric layer is formed on the first electrode, wherein the photosensitive silicon-rich dielectric layer comprises a plurality of nanocrystalline silicon crystals. A second electrode is formed on the photosensitive silicon-rich dielectric layer.

17 Claims, 8 Drawing Sheets

METHOD OF FORMING OPTICAL SENSOR

CROSS REFERENCE TO RELATED APPLICATIONS

This application is a division of application Ser. No. 12/346,857 filed on Dec. 31, 2008.

BACKGROUND OF THE INVENTION

1. Field of the Invention

The present invention relates to an optical sensor and method of making the same, and more particularly, to a silicon-rich dielectric photosensitive device using silicon-rich dielectric layer as a photosensitive layer, and method of making the same.

2. Description of the Prior Art

Due to the novel applications of fiber-optic communication and various types of thin film transistor (TFT) display, the requirement for optical sensors or receivers is according increasing. The conventional optical sensor uses III A group element and V A group element to form PN (P-type dopant/N-type dopant) junction sensor or PIN (P-type dopant/intrinsic/N-type dopant) junction sensor. The PN/PIN junction sensor, however, is based on indirect energy gap mechanism, which has low optical absorption efficiency. Also, the conventional PN/PIN junction sensor is apt to be influenced by non-target light source, and therefore has high bias. In the fabrication of TFT displays, the PN/PIN junction sensor made of III A group element and V A group element and the TFT have problems in process compatibility. In addition, the PN/PIN junction sensor is formed adjacent to peripheral circuits, which may generate signal interference and lead to a trade-off between the aperture ratio and photosensitive efficiency in design. Based on the aforementioned reasons, PN/PIN junction sensor can no longer fulfill the requirement in many opto-electronic applications.

SUMMARY OF THE INVENTION

It is therefore one objective of the present invention to provide a silicon-rich dielectric photosensitive device and method of making the same to improve the applications and compatibility of optical sensors.

According to the present invention, an optical sensor is provided. The optical sensor includes a silicon-rich dielectric photosensitive device, and a read-out device. The silicon-rich dielectric photosensitive device includes a first electrode, a second electrode, and a photosensitive silicon-rich dielectric layer disposed between the first electrode and the second electrode. The photosensitive silicon-rich dielectric layer includes a plurality of nanocrystalline silicon crystals. The read-out device is electrically connected to the first electrode of the silicon-rich dielectric photosensitive device to read out opto-electronic signals generated by the photosensitive silicon-rich dielectric layer.

According to the present invention, a method of forming an optical sensor is provided. The method includes the following steps. First, a substrate is provided, and a read-out device is formed on the substrate. Then, a first electrode electrically connected to the read-out device is formed on the substrate. Subsequently, a photosensitive silicon-rich dielectric layer is formed on the first electrode, wherein the photosensitive silicon-rich dielectric layer comprises a plurality of nanocrystalline silicon crystals. Following that, a second electrode is formed on the photosensitive silicon-rich dielectric layer.

The present invention uses nanocrystalline silicon as optical absorption and current conversion media, which has higher optical absorption efficiency and conversion efficiency due to its direct energy gap mechanism, compared with the crystalline silicon of the conventional PN/PIN junction sensor. In addition, the method of forming the silicon-rich dielectric layer of the optical sensor is highly compatible with standard semiconductor process.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
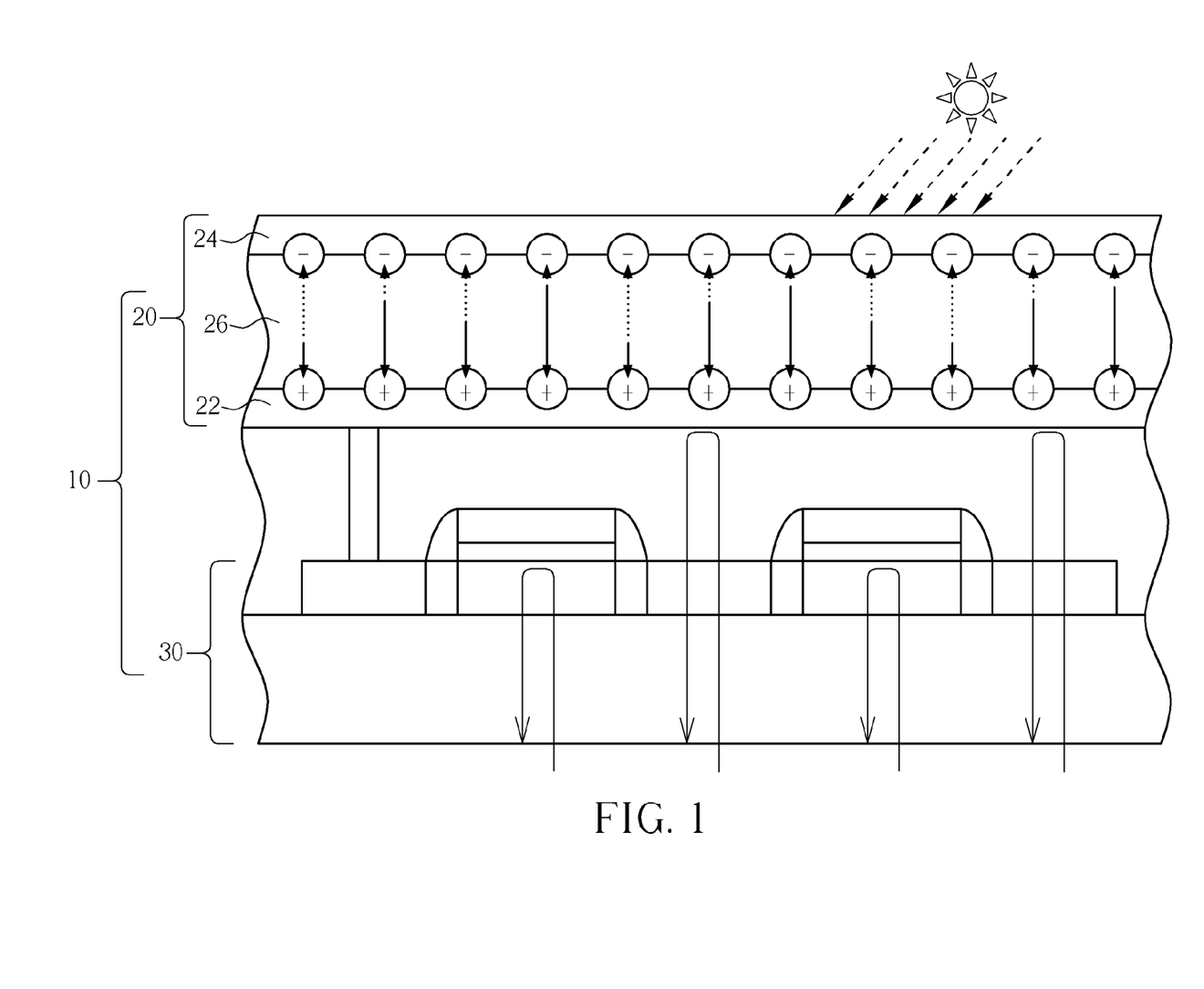
FIG. 1 schematically illustrates an optical sensor according to a preferred embodiment of the present invention.

FIG. 1 schematically illustrates an optical sensor according to a preferred embodiment of the present invention. As shown in FIG. 1, the optical sensor 10 includes a silicon-rich dielectric photosensitive device 20 and a read-out device 30. The silicon-rich dielectric photosensitive device 20, which has a structure similar to a capacitor, includes a first electrode 22, a second electrode 24, and a photosensitive silicon-rich dielectric layer 26 disposed between the first electrode 22 and the second electrode 24. The photosensitive silicon-rich dielectric layer 26 may further includes nanocrystalline silicon crystals formed therein. One of the first electrode 22 and the second electrode 24 preferably include a transparent electrode or made of transparent material. In this embodiment, the silicon-rich dielectric photosensitive device 20 may be disposed over the read-out device 30, and the first electrode 22 is electrically connected to the read-out device 30. The read-out device 30 may be any type of electronic device able to read out signals, for instance, a TFT read out device. The TFT read out device is electrically connected to the first electrode 22 of the silicon-rich dielectric photosensitive device 20 so as to read opto-electronic signals generated by the photosensitive silicon-rich dielectric layer 26.

In this embodiment, the photosensitive silicon-rich dielectric layer 26 includes a plurality of nanocrystalline silicon crystals or nanocrystalline silicon particles which is approximately based on direct energy gap mechanism, and the photosensitive silicon-rich dielectric layer 26 has an energy gap substantially between 1.2 and 4 e.v. Therefore, the nanocrystalline silicon crystal has higher photosensitive efficiency (optical absorption efficiency) and conversion efficiency than the crystalline silicon of the conventional PN/PIN junction sensor. The photosensitive silicon-rich dielectric layer 26 uses silicon-rich material layer formed by silicon-rich compound, where the ratio of silicon in silicon-rich compound is more than the stoichiometric ratio of silicon compound. Take silicon oxide (SiOx) as an example. A silicon oxide compound having a stoichiometric ratio is silicon dioxide (SiO2). If the percentage of silicon exceeds 33.3% for instance, the silicon oxide compound is considered as a silicon-rich oxide (SiOx), where x is substantially between 0.1 and 2. In this embodiment, the photosensitive silicon-rich dielectric layer 26 may be an amorphous phase silicon-rich dielectric layer, but the photosensitive silicon-rich dielectric layer 26 may also include nanocrystalline silicon crystal with a diameter between 0.5 and 200 nanometers. The photosensitive silicon-rich dielectric layer 26 may be a silicon-rich oxide (SiOx) layer, a silicon-rich nitride (SiNy) layer, a silicon-rich oxynitride (SiOxNy) layer, a hydrogenated silicon-rich oxynitride (SiHwOxNy) layer, a silicon-rich oxycarbide (SiOxCz) layer, a silicon-rich carbide (SiCz) layer, or a composite structure of the above materials. When silicon-rich nitride (SiNy) is selected as the material of the photosensitive silicon-rich dielectric layer 26, y is greater than 0.1 and less than 1.33 for instance. When hydrogenated silicon-rich oxynitride (SiHwOxNy) is selected as the material of the photosensitive silicon-rich dielectric layer 26, w is between 0.1 and 1, x is between 0.1 and 2, and y is between 0.1 and 1.33 for instance. When silicon oxycarbide (SiOxCz) is selected as the material of the photosensitive silicon-rich dielectric layer 26, x is between 0.1 and 2, and z is between 0.1 and 1 for instance. The silicon-rich oxide (SiOx) layer, when used as the photosensitive silicon-rich dielectric layer 26, has a refractive index between 1.5 and 3.75 for instance. The silicon-rich nitride (SiNy) layer, when used as the photosensitive silicon-rich dielectric layer 26, has a refractive index between 1.7 and 3.8 for instance. The silicon-rich oxynitride (SiOxNy) layer, when used as the photosensitive silicon-rich dielectric layer 26, has a refractive index between 1.6 and 3.8 for instance. The material of the photosensitive silicon-rich dielectric layer 26 is not limited to the above materials, and may be other suitable silicon-rich compound.

In this embodiment, the first electrode 22 is a metal electrode and the second electrode 24 is a transparent electrode. Accordingly, the silicon-rich dielectric photosensitive device 20 can sense the light beams (front light beams) entering from the direction the second electrode 24, while the light beams (back light beams) coming from the direction of the first electrode 22 is blocked. Consequently, interference is prevented. The front light beams, when irradiate on the photosensitive silicon-rich dielectric layer 26, will excite electron-hole pairs, thereby generating photo current. The photo current is then read by the read-out device 30.

Figure 2:
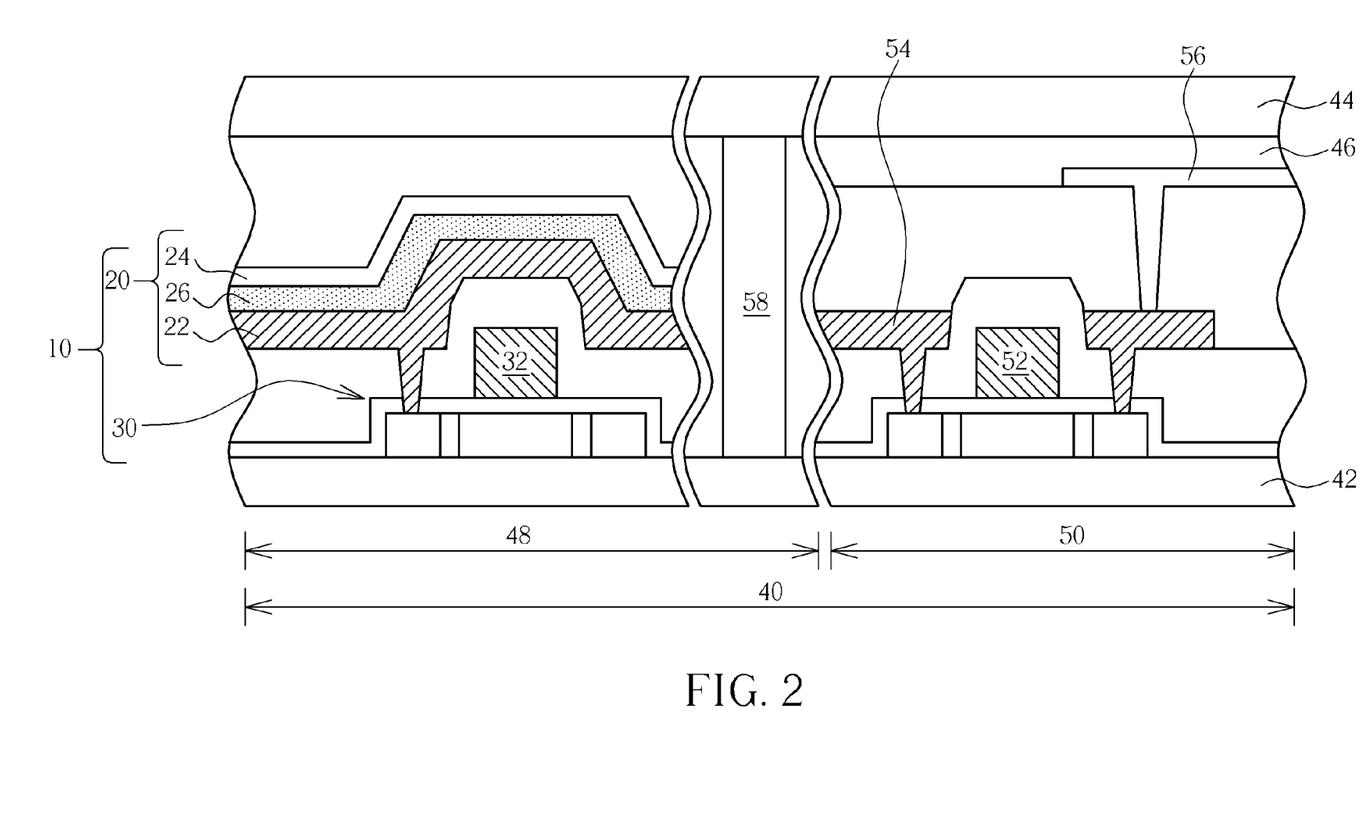
FIG. 2 schematically illustrates an optical sensor integrated into a display device according to an embodiment of the present invention.

FIG. 2 schematically illustrates an optical sensor integrated into a display device according to an embodiment of the present invention. As shown in FIG. 2, the optical sensor 10 is integrated into a display device 40 such as a TFT LCD in this embodiment. The display device 40 includes an array substrate 42, a color filter (CF) substrate 44, and a liquid crystal layer 46 disposed between the array substrate 42 and the CF substrate 44. The display device 40 includes a non-display region 48 and a display region 50, where the optical sensor 10 is disposed in the non-display region 48. The optical sensor 10 of the display device 40 is used as an ambient light sensor (ALS), such that the brightness of back light can be modified according to the intensity of ambient light to optimize the brightness of display images. The fabrication of the optical sensor 10 can be integrated into the fabrication of the TFT LCD. Therefore, the read-out device 30 can be formed on the array substrate 42 of the display device 40, and integrated into the TFT process in the display region 50 or the peripheral circuit process. For instance, the process of forming the gate electrode 32 of the read-out device 30 can be integrated into the process of forming the gate electrode 52 of the TFT in the display region 50. In addition, the process of forming the silicon-rich dielectric photosensitive device 20 disposed over the read-out device 30 can be integrated into the process of forming the pixel structure of the display device 40. In this embodiment, the first electrode 22 of the silicon-rich dielectric photosensitive device 20 can be a metal electrode, and the process can be integrated into the process of forming the data line 54 of the TFT in the display region 50; The second electrode 24 may be a transparent electrode, and the process can be integrated into the process of forming the pixel electrode 56 in the display region 50. Also, in this embodiment, the display device 40 includes a sealant 58 disposed between the array substrate 42 and the CF substrate 44, and the optical sensor 10 used as an ambient light sensor is disposed outside the sealant 58.

Figure 3:
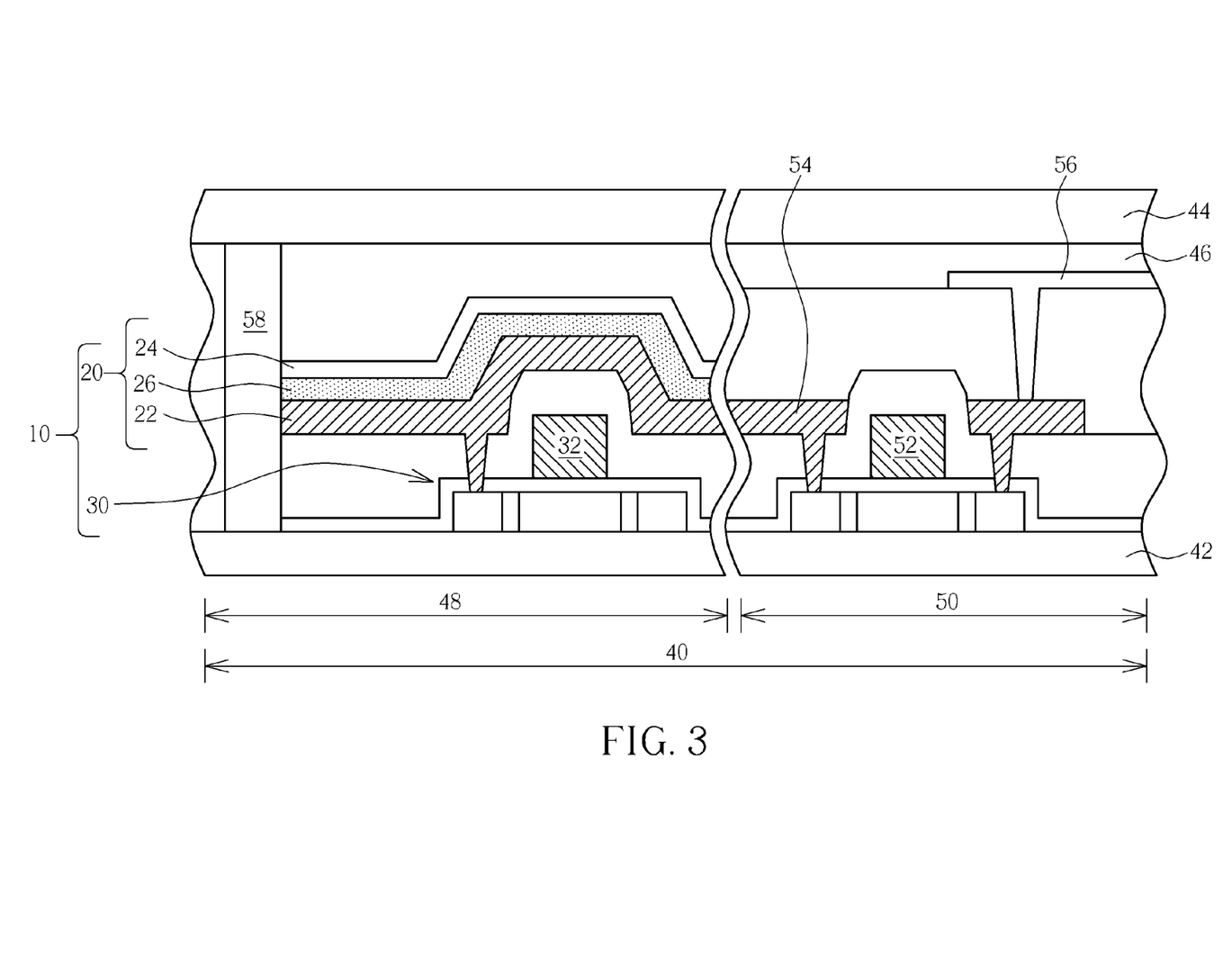
FIG. 3 schematically illustrates an optical sensor integrated into a display device according to another embodiment of the present invention.

FIG. 3 schematically illustrates an optical sensor integrated into a display device according to another embodiment of the present invention. In the present and above embodiments, identical components are denoted by identical numerals, and are not redundantly described. As shown in FIG. 3, the optical sensor 10 is disposed inside the sealant 58 in this embodiment, instead of outside the sealant 58.

Figure 4:
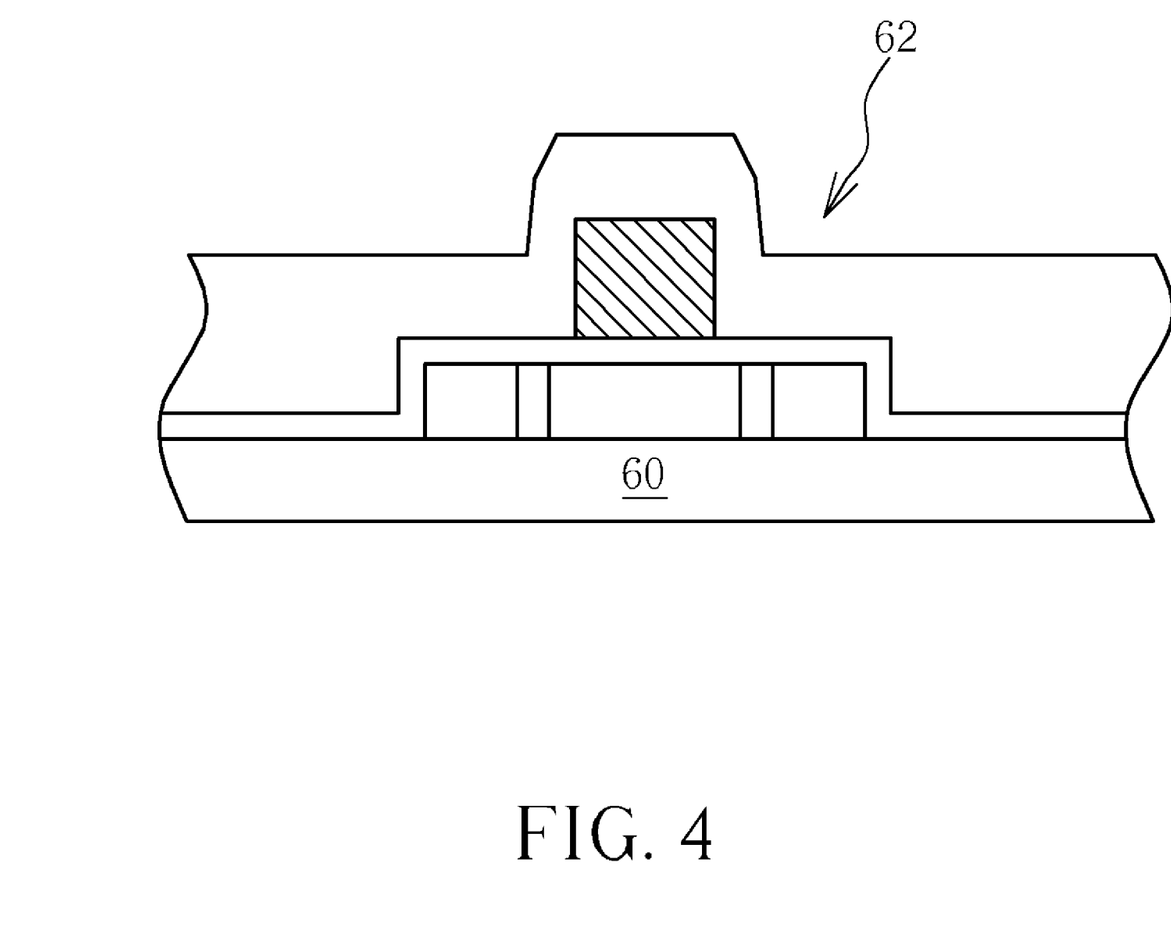
FIGS. 4-7 are schematic diagrams illustrating a method of forming an optical sensor according to an embodiment of the present invention.

FIGS. 4-7 are schematic diagrams illustrating a method of forming an optical sensor according to an embodiment of the present invention. As shown in FIG. 4, a substrate 60 is provided, and a read-out device 62 is formed on the substrate 60. In this embodiment, the read-out device 62 is a TFT read-out device, but not limited. The read-out device 62 may be any other types of suitable read-out device.

Figure 5:
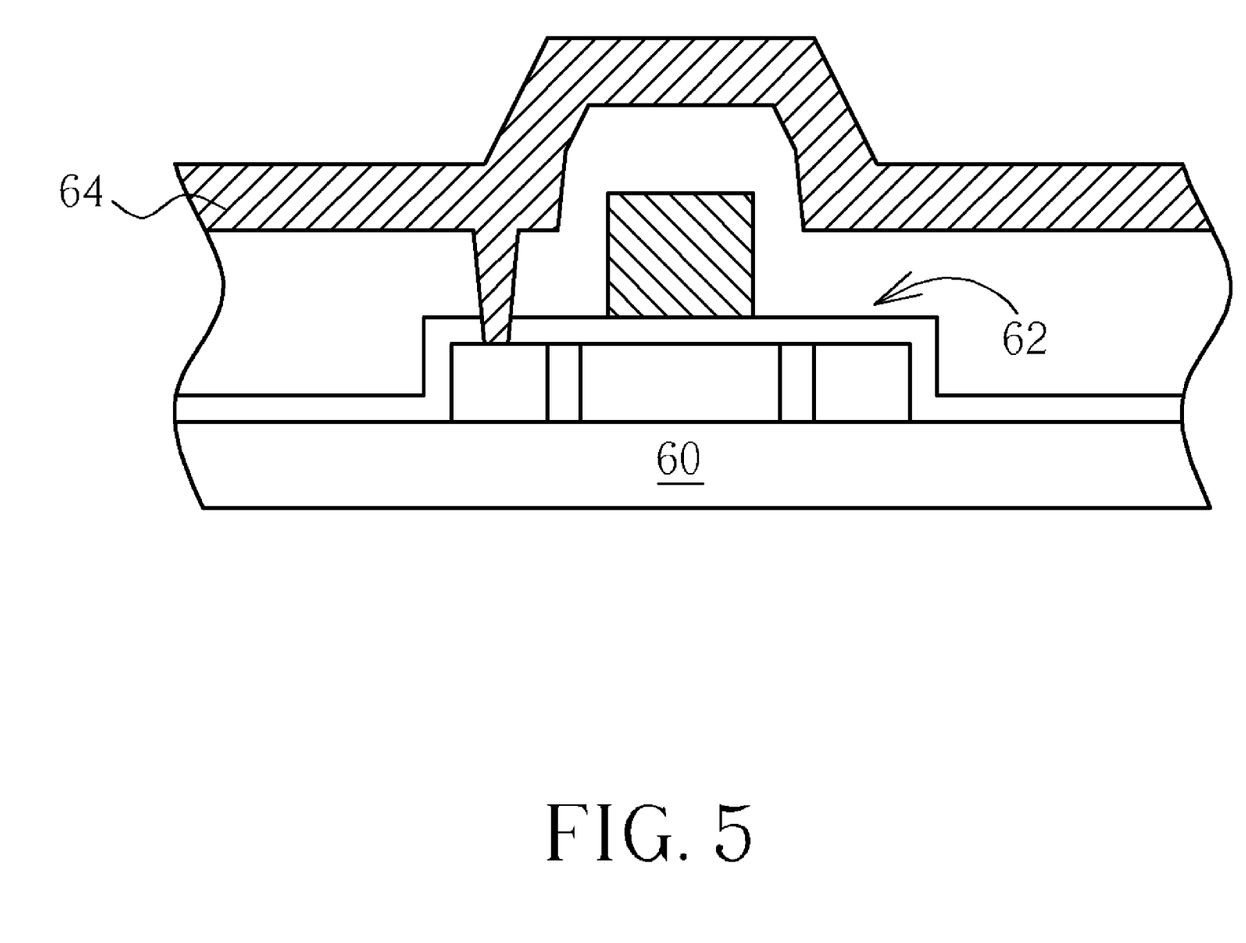

As shown in FIG. 5, a first electrode 64 is formed on the substrate 60 and the read-out device 62, and the first electrode 64 is electrically connected to a node e.g. a source electrode of the read-out device 62. In this embodiment, the first electrode 64 is a metal electrode made of any suitable metal, and formed by PVD, CVD or other appropriate methods.

Figure 6:
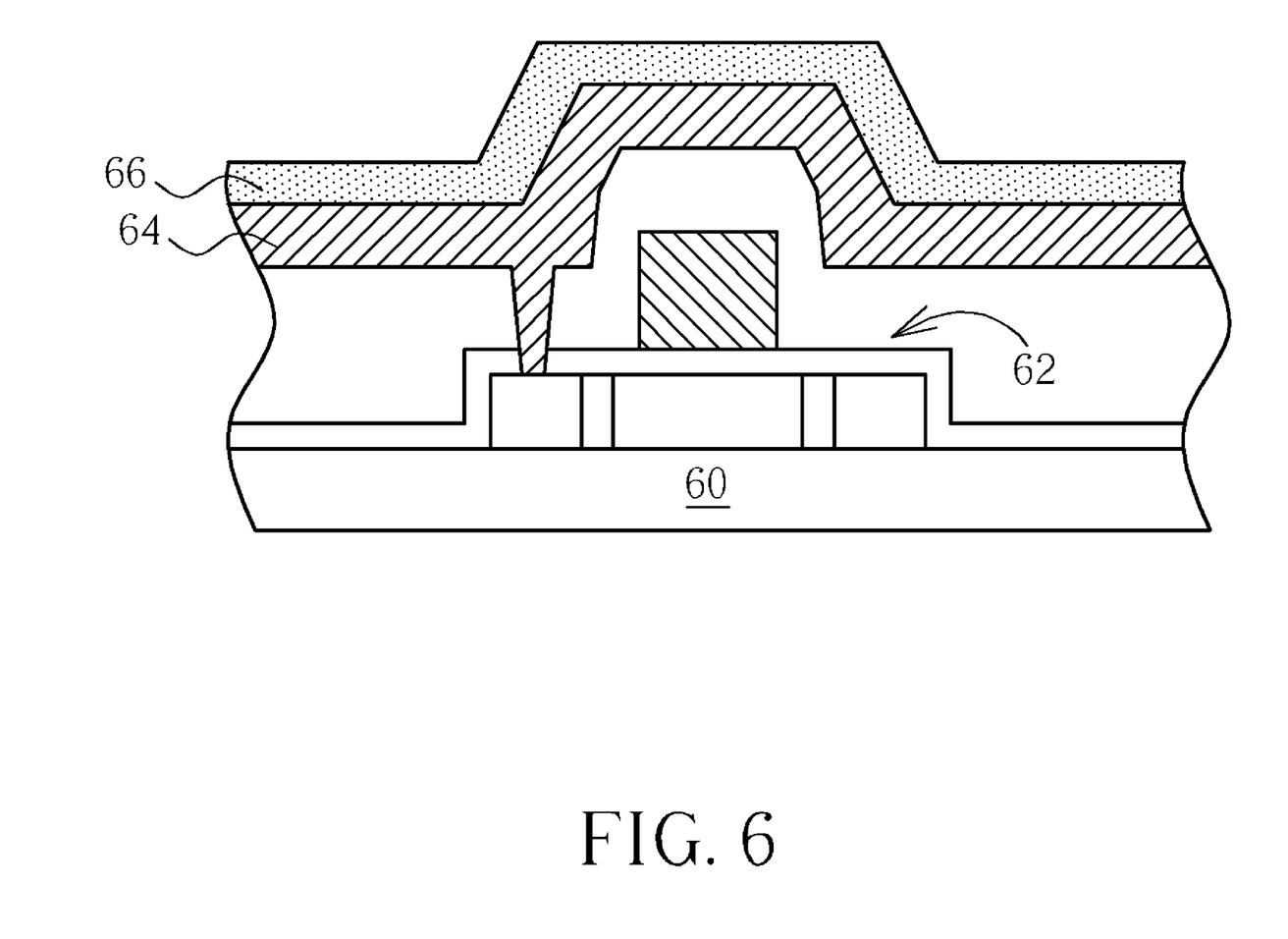

As shown in FIG. 6, a photosensitive silicon-rich dielectric layer 66 is formed on the first electrode 64, and the photosensitive silicon-rich dielectric layer 66 includes nanocrystalline silicon crystals having a diameter between 0.5 and 200 nanometers. The photosensitive silicon-rich dielectric layer 66 may be for instance a silicon-rich nitride layer or a silicon-rich oxynitride layer. The silicon-rich nitride layer and the silicon-rich oxynitride may be formed by plasma enhanced chemical vapor deposition (PECVD) process, but under different process conditions. The process conditions for forming the silicon-rich nitride layer and the silicon-rich oxynitride layer are exemplarily described as follows.

1. When Silicon-rich Nitride is Used as the Photosensitive Silicon-rich Dielectric Layer:

Perform a PECVD process to form the silicon-rich nitride layer under the following conditions:

Reaction gases: silane ($SiH_4$) and a nitrogen source gas, wherein the ratio of silane to the nitrogen source gas is between 15 and 1; the nitrogen source gas may be at least one of ammonia (NH3) and nitrogen (N2), i.e. the nitrogen source gas may be ammonia or nitrogen, or a mixture thereof. Also, the nitrogen source gas may be other nitrogen-containing gas;

Reaction temperature: between 250 and 400° C.;

Upper and lower powers: between 300 and 1700 W;

Pressure: between 800 and 1500 mtorr; and

Reaction time: between 15 and 120 seconds.

Under the above conditions, a silicon-rich nitride layer having a molecular formula SiNy may be formed by the PECVD process, where y is between 0.1 and 1.33.

2. When Silicon-rich Oxynitride is Used as the Photosensitive Silicon-rich Dielectric Layer:

Perform a PECVD process to form the silicon-rich oxynitride layer under the following conditions:

Reaction gases: silane and a nitrogen source gas, wherein the ratio of silane to the nitrogen source gas is between 5 and 0.3; the nitrogen source gas may be nitrous oxide ($N_2O$); at least one of nitrous oxide, ammonia, and oxygen; oxygen and at least one of ammonia and nitrogen; or other nitrogen-containing gas and oxygen-containing gas;

Reaction temperature: between 250 and 400° C.;
Upper and lower powers: between 300 and 1700 W;
Pressure: between 800 and 1500 mtorr; and
Reaction time: between 15 and 120 seconds.

Under the above conditions, a silicon-rich oxynitride layer having a molecular formula $SiO_xN_y$ may be formed after the PECVD process, where x is between 0.1 and 2, and y is between 0.1 and 1.33.

By performing the above PECVD process, an amorphous phase photosensitive silicon-rich dielectric layer 66, or a photosensitive silicon-rich dielectric layer 66 having nanocrystalline silicon crystals may be formed. An annealing process, e.g. a thermal annealing process or a laser annealing process may be selectively performed after the photosensitive silicon-rich dielectric layer 66 is formed to form nanocrystalline silicon crystals inside the photosensitive silicon-rich dielectric layer 66 or to increase the size of the nanocrystalline silicon crystals, such that the photosensitivity can be further improved.

Figure 7:
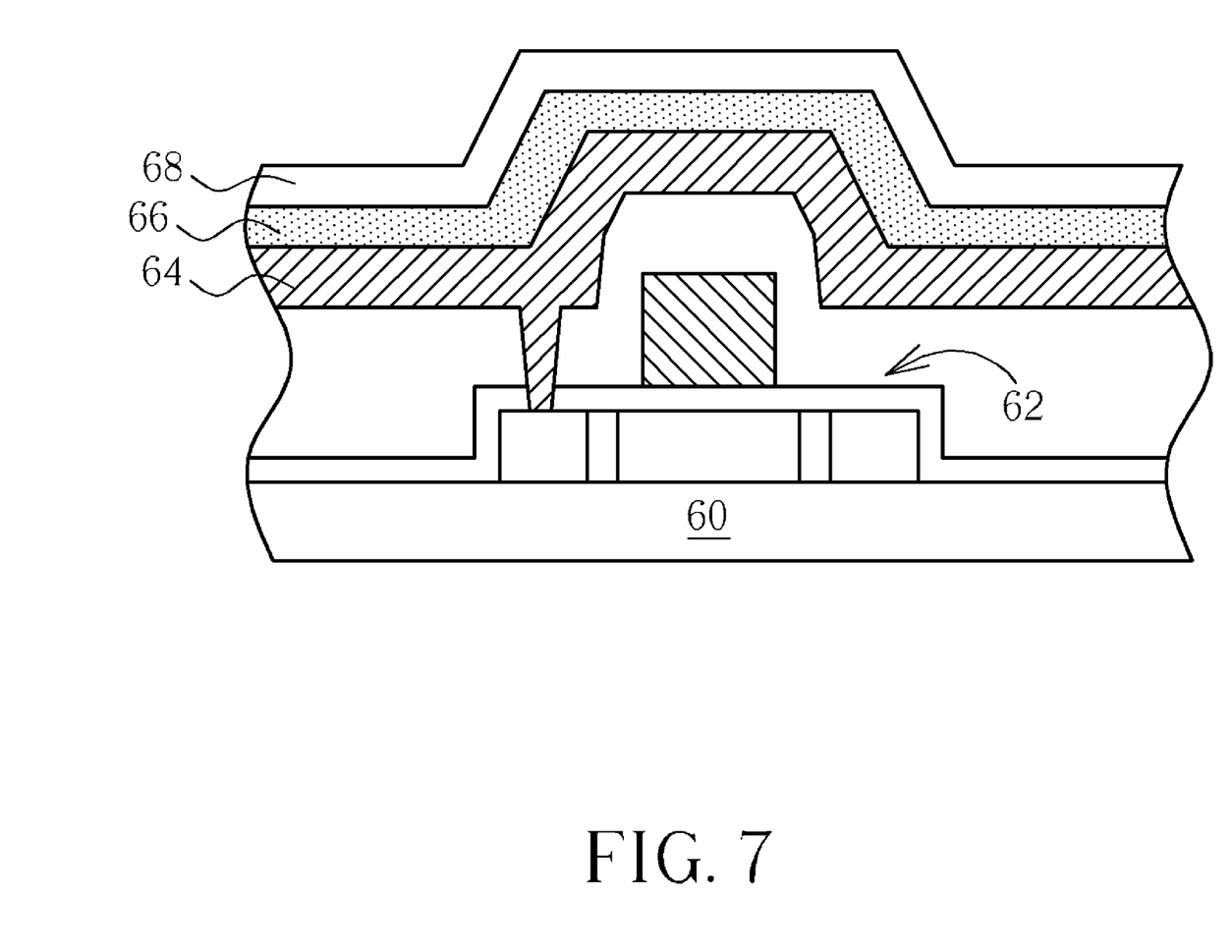

As shown in FIG. 7, a second electrode 68 is formed on the photosensitive silicon-rich dielectric layer 66. In this embodiment, the second electrode 68 is a transparent electrode made of any suitable transparent conductive materials and formed by PVD, CVD or other suitable methods.

Figure 8:
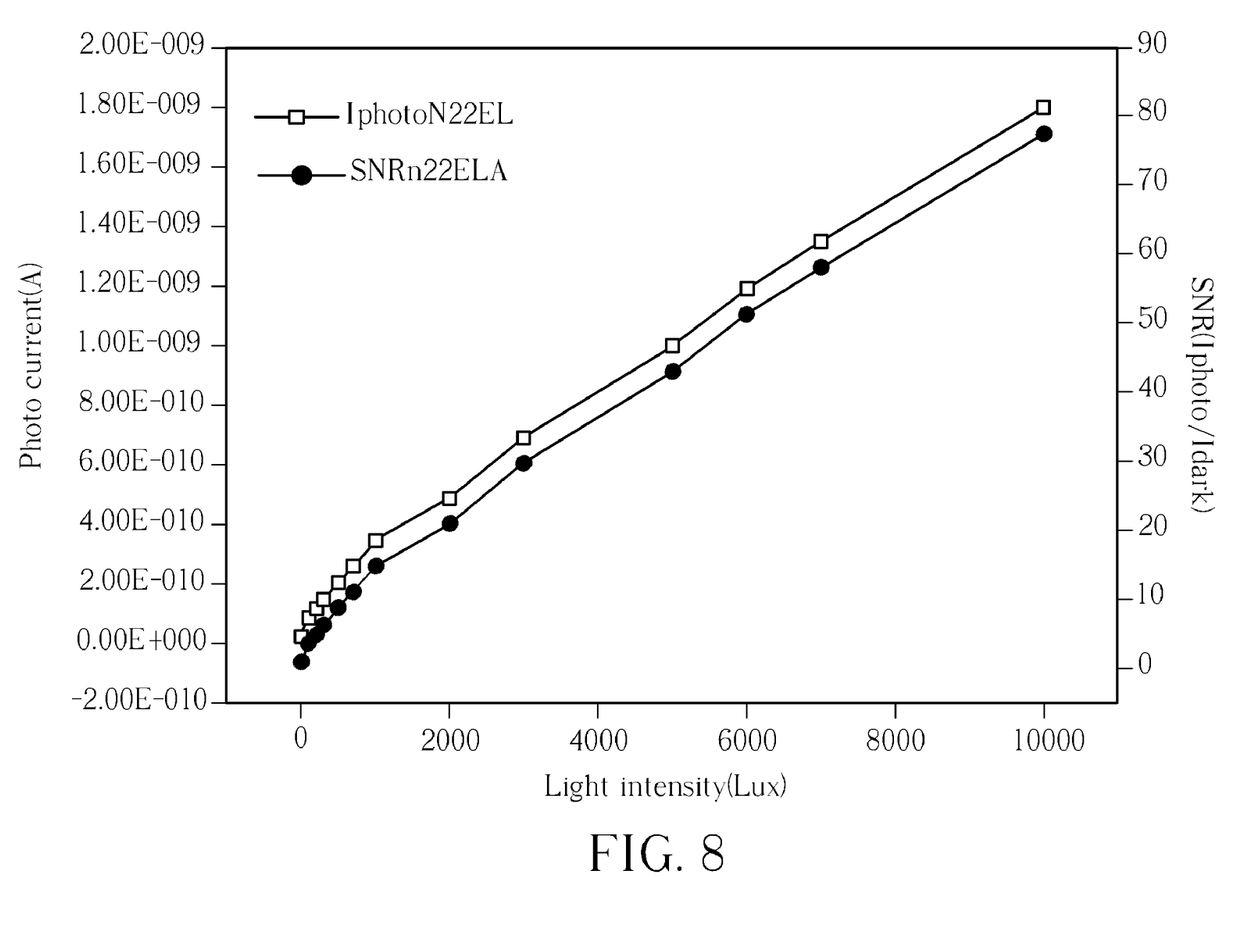
FIG. 8 shows an experimental result of the photosensitivity of the optical sensor with respect to different light intensity.

FIG. 8 shows an experimental result of the photosensitivity of the optical sensor with respect to different light intensity. The curve "IphotoN22EL" represents the relation between the photo current and the light intensity; and the curve "SNRn22ELA" represents the signal noise ratio (SNR), i.e. the ratio of photo current to dark current (Iphoto/Idark). As shown in FIG. 8, SNR increases as the light intensity increases, therefore the sensitivity of the optical sensor is higher when the ambient light intensity increases. Evidently, the optical sensor of the present invention has improved photosensitivity.

In conclusion, the optical sensor and the method of making the same have the following advantages.

The silicon-rich dielectric photosensitive device may be preferably disposed atop without being adjacent to the peripheral circuit, thus the interference between the peripheral circuit and the silicon-rich dielectric photosensitive device is prevent, and the aperture ratio is improved.

The silicon-rich dielectric photosensitive device may be preferably disposed atop, which can improve optical absorption efficiency because less light beams are blocked.

The nanocrystalline silicon is used as optical absorption and current conversion media, which has higher optical absorption efficiency and conversion efficiency due to its direct energy gap mechanism, compared with the crystalline silicon of the conventional PN/PIN junction sensor.

The bottom electrode (first electrode) is a metal electrode, which can shield back light beams and reflect front light beams, and the top electrode (second electrode) is a transparent electrode, which allows front light beams to pass. Therefore, the optical absorption effect of the front light beams is enhanced.

Silicon-rich dielectric layer used as the material of the photosensitive layer is highly compatible with standard semiconductor process.

The PECVD process for forming the photosensitive silicon-rich dielectric layer is a low temperature process (under 400° C.), and thus glass substrate or plastic substrate may be used. Consequently, the optical sensor can be integrated into the fabrication of display device such as LTPS TFT LCD.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming an optical sensor, comprising:
   providing a substrate, and forming a read-out device on the substrate;
   forming a first electrode electrically connected to the read-out device on the substrate;
   forming a photosensitive silicon-rich dielectric layer on the first electrode, wherein the photosensitive silicon-rich dielectric layer comprises a plurality of nanocrystalline silicon crystals; and
   forming a second electrode on the photosensitive silicon-rich dielectric layer.

2. The method of claim 1, wherein the first electrode comprises a metal electrode, and the second electrode comprises a transparent electrode.

3. The method of claim 1, wherein the nanocrystalline silicon crystal has a diameter substantially between 0.5 and 200 nanometers.

4. The method of claim 1, wherein the read-out device comprises a thin film transistor read-out device.

5. The method of claim 1, wherein the optical sensor comprises an ambient light sensor disposed in a non-display region of a display device.

6. The method of claim 1, wherein the photosensitive silicon-rich dielectric layer comprises a silicon-rich nitride layer having a molecular formula of $SiN_y$, and y is greater than 0.1 and less than 1.33.

7. The method of claim 6, wherein forming the photosensitive silicon-rich dielectric layer comprises performing a plasma enhanced chemical vapor deposition process to deposit the silicon-rich nitride layer on the substrate.

8. The method of claim 7, wherein the plasma enhanced chemical vapor deposition process uses silane to react with a nitrogen source gas to form the silicon-rich nitride layer, and the ratio of the silane to the nitrogen source gas is substantially between 15 and 1.

9. The method of claim 8, wherein the nitrogen source gas comprises at least one of ammonia and nitrogen.

10. The method of claim 7, wherein the plasma enhanced chemical vapor deposition process is performed in a temperature range substantially between 250 and 400° C.

11. The method of claim 1, wherein the photosensitive silicon-rich dielectric layer comprises a silicon-rich oxynitride layer having a molecular formula of $SiO_xN_y$, x is between 0.1 and 2, and y is between 0.1 and 1.33.

12. The method of claim 11, wherein forming the photosensitive silicon-rich dielectric layer comprises performing a plasma enhanced chemical vapor deposition process to deposit the silicon-rich oxynitride layer on the substrate.

13. The method of claim 11, wherein the plasma enhanced chemical vapor deposition process uses silane to react with a nitrogen-oxygen source gas to form the silicon-rich oxynitride layer, and the ratio of the silane to the nitrogen-oxygen source gas is substantially between 5 and 0.3.

14. The method of claim 13, wherein the nitrogen-oxygen source gas comprises nitrous oxide ($N_2O$).

15. The method of claim 14, wherein the nitrogen-oxygen source gas comprises at least one of ammonia, nitrogen and oxygen.

16. The method of claim 13, wherein the nitrogen-oxygen source gas comprises oxygen, and at least one of ammonia and nitrogen.

17. The method of claim 12, wherein the plasma enhanced chemical vapor deposition process is performed in a temperature range substantially between 250 and 400° C.

* * * * *